United States Patent
Aydin et al.

(10) Patent No.: US 10,343,606 B2
(45) Date of Patent: Jul. 9, 2019

(54) USING PARALLEL DATA LINES FOR GPIO PURPOSES

(71) Applicant: Connaught Electronics Ltd., Tuam, County Galway (IE)

(72) Inventors: Mutlu Aydin, Tuam (IE); Ganapathi Ramachandra, Tuam (IE); Mohammed Nasr, Tuam (IE)

(73) Assignee: Connaught Electronics Ltd., Tuam, County Galway (IE)

( * ) Notice: Subject to any disclaimer, the term of this patent is extended or adjusted under 35 U.S.C. 154(b) by 0 days.

(21) Appl. No.: 15/588,023

(22) Filed: May 5, 2017

(65) Prior Publication Data

US 2018/0324386 A1 Nov. 8, 2018

(51) Int. Cl.
| | | |
|---|---|---|
| *H04N 7/10* | (2006.01) | |
| *H04N 7/18* | (2006.01) | |
| *B60R 1/00* | (2006.01) | |
| *H03M 9/00* | (2006.01) | |

(52) U.S. Cl.
CPC ............... *B60R 1/00* (2013.01); *H03M 9/00* (2013.01); *H04N 7/18* (2013.01); *H04N 7/183* (2013.01)

(58) Field of Classification Search
CPC ........ G06F 13/128; G06F 13/161; H03M 9/00
USPC ........ 348/720, 721, 571, 118, 552; 370/336, 370/535, 536
See application file for complete search history.

(56) References Cited

U.S. PATENT DOCUMENTS

2009/0323731 A1* 12/2009 Lee .................... H03M 9/00
                                                                    370/536
2017/0228327 A1* 8/2017 Mishra ............... G06F 13/161

* cited by examiner

*Primary Examiner* — Jefferey F Harold
*Assistant Examiner* — Jean W Desir
(74) *Attorney, Agent, or Firm* — Osha Liang LLP

(57) ABSTRACT

A camera system for a vehicle that includes a camera unit having a serializer and a control unit having a deserializer connected to the serializer is provided. The deserializer includes a plurality of data contacts for parallel data output. One or more of the data contacts are data contact general purpose inputs/outputs (GPIO) pins that communicates with GPIO pins of a data processing unit of the control unit.

16 Claims, 5 Drawing Sheets

Fig. 1 --Prior Art--

USING PARALLEL DATA LINES FOR GPIO PURPOSES

FIELD OF THE INVENTION

In general, in one aspect, the present invention relates to a camera system for a vehicle and a method for operating the camera system for a vehicle.

BACKGROUND OF INVENTION

Vehicles and specifically cars or trucks may be equipped with one or more cameras. The camera is connected to an electric control unit (ECU) for processing of the video data. Such camera-ECU may be of the LVDS (Low Voltage Differential Signaling) type.

Furthermore, the video data from the camera may be transmitted to the ECU by a cable of the PoC (Power over Coax) or STP (Single Twisted Pair) type. Thus, the video data from the camera are transmitted serially to the ECU. This requires a serializer on the camera side and a deserializer on the ECU side.

In the existing LVDS type of camera-ECU systems the number of GPIOs (General Purpose Input/Output) available in the SerDes (Serializer-Deserializer) chip set is limited. Typically, SerDes chip sets have up to 4 GPIOs. As per supplier road map the number will remain the same due to the package, the silicon chip properties and/or cost factors.

Having a limited number of GPIOs available between the camera and the ECU introduces design restrictions. Specifically, due to the advanced designs, lower sizes of cameras are required for simple mountings which imply that many features/functions are controlled, managed or monitored. Eventually the cameras fully become a slave (no MCU (Micro Controller Unit) on camera) and are controlled or monitored by an ECU as the master. These architectural changes require more feature sets especially on the SerDes chip sets, and one such requirement is the increased need of available GPIOs. But as highlighted, the suppliers usually provide limited GPIOs.

The camera system of FIG. 1 shows a camera unit 1 which is connected to a control unit 2, herein also called ECU. Both units 1 and 2 may be connected via a serial connection 3. The camera unit 1 may include a video sensor not shown in FIG. 1. The video sensor provides a parallel video signal via parallel data lines D[x:0], which means a plurality of single data lines D[0], D[1], D[2], . . . , D[x]. The respective video signal is input to a serializer 4 of the camera unit 1. The serializer 4 has respective input bins (also called data contacts) D0, D1, D2, . . . , Dx. Furthermore, the serializer includes an input HSYNC for a horizontal synchronization signal HS, an input VSYNC for a vertical synchronization signal VS and an input PCLKIN for a pixel clock signal PCLK.

Additionally, the serializer 4 has four general purpose input/output pins GPIO0, GPIO1, GPIO2 and GPIO3. Thus, the serializer 4 can receive video data and optionally synchronization signals and a clock as well as other control signals via the GPIOs. The serializer 4 processes these signals to a serial signal transmittable via the serial connection 3 to the control unit 2.

The control unit 2 includes a deserializer 5 to deserialize the serial signal received from the camera unit 1. Therefore, the deserializer 5 has a plurality of data pins or contacts D0, . . . , Dx. Furthermore, the deserializer 5 has outputs HSYNC, VSYNC and PCLK as well as four GPIOs in the present case. The desirializer 5 delivers signals/data to a video processor 6 and/or a micro control unit 7. Therefore, the video processor 6 has a corresponding number of data pins/data contacts D0 to Dx for receiving the data signals from data lines D[0], D[1], . . . , D[x] from the deserializer 5. Furthermore, the video processor 6 has respective dedicated GPIOs (four in the present case) in order to receive respective signals from the GPIOs of the deserializer 5. For the sake of clarity input pins for the horizontal synchronization signal HS, the vertical synchronization signal VS and the pixel clock PCLK from the deserializer 5 are not shown in the diagram of the video processor 6.

The micro control unit 7 also has several dedicated GPIOs. In the example of FIG. 1 the micro control unit 7 has four GPIOs for exchanging signals with the respective GPIOs of the deserializer 5. One GPIO of the micro control unit 7 is not used in the present example.

The limited number of GPIOs available between the video processor 6 and the micro control unit 7 on the one hand and the deserializer 5 on the other hand introduces design restrictions. Therefore, according to the present invention it is proposed to increase the number of monitored I/Os in the overall design by using unused digital parallel video pins on the SerDes chip set. Thus, not only the dedicated, i.e. the specifically intended GPIOs can be used by either the video processor 6 or the micro control unit 7.

SUMMARY OF INVENTION

One or more embodiments of the present invention increases the number of monitored I/Os in the overall design of an ECU with a deserializer.

In general, in one or more embodiments a camera system for a vehicle includes a camera unit that includes a serializer. The camera system is usable for a vehicle, specifically a car or a truck. The camera system includes a camera unit that captures video data. The video data are provided in parallel by a camera chip. Therefore, if video data has to be transmitted serially, the camera unit needs a serializer in order to rearrange the parallel video data to serial video data.

Further, in one or more embodiments the camera system includes a control unit that includes a deserializer connected to the serializer. The control unit may be an ECU. The serializer of the camera and the deserializer of the control unit are connected via a serial data link to enable serial data transmission between the camera and the control unit.

The deserializer includes a plurality of data contacts for parallel data output. Typically, these data contacts for parallel data output are used to transmit the video data in parallel to other units within the ECU. For instance, the video date are transferred by 8 bit, 10 bit or 11 bit in parallel.

According to one or more embodiments, one or more of the data contacts are used as general purpose inputs/outputs (GPIOs) for communication with a data processing unit of the control unit. In other words, the one or more data contacts are not used for video data transmission, but are used for the transmission of control data. This enables control data to be transmitted from the deserializer to the other data processing unit of the control unit via the data contacts, which increases the design variability for camera-ECU systems.

In one or more embodiments, the data processing unit of the control unit includes a system-on-chip (SoC) and/or a micro control unit (MCU). The ECU may include a specific video processor, specifically a single chip unit.

Furthermore, the control unit may be of the low voltage differential signaling type (LVDS). The control unit is compatible with a pregiven interface standard.

Specifically, the deserializer of the camera system may have dedicated GPIOs, which are GIPOs intended for communication with GPIOs of the data processing unit of the control unit, beside the data contacts. Consistent with the above, one or more of the other data processing units of the ECU are also provided with dedicated GPIOs that are intended to communicate with the dedicated GPIOs of the deserializer.

In one or more embodiments, beside the normal GPIOs, one or more data outputs (data contacts) may be used as a GPIO (herein referred to as "data contact GPIOs"). The deserializer has one or more data contact GPIOs in addition to the normal GPIOs that were originally included.

According to a further development of one or more embodiments, the data contacts GPIOs are only deployable for output purposes. In other words, the data contact GPIOs of the deserializer that are used for control purposes do not have to have other principal functions other than the original data outputs/data contacts functions.

Additionally, a digital parallel video signal level of the serializer may be configurable. Specifically, the digital parallel video signal level may depend on the video source and/or the SerDes configuration. For example, the digital parallel video signal level of the serializer may be configured using voltage levels of 1.8 V and 3.3 V.

In one or more embodiments, a pixel clock may be used for data transfer from the data contacts of the deserializer to the data processing unit. For example, the parallel video data monitoring and the monitoring of the data contact used as GPIO can be done once the pixel clock is available. Specifically, a clock contact may be provided at the deserializer and the other data processing unit of the control unit.

In one or more embodiments, a driver assistant system includes a camera system as described above. The driver assistance system may assist the driver with video images obtained from the camera unit from the surrounding of the vehicle. Due to the specific usage of the data contacts as GPIOs the functionality of the camera system may be specifically adapted to the driver assistance system.

Furthermore, one or more embodiments of a vehicle include the driver assistance system as mentioned above or the camera system as mentioned above. Therefore, specific variability of the camera system may be used for a vehicle.

In one or more embodiments a method for operating a camera system for a vehicle is provided. The camera system includes a camera unit that includes a serializer and a control unit that includes a deserializer connected to the serializer, and the deserializer includes a plurality of data contacts for parallel data output. The method includes the step of using one or more of the data contacts as General Purpose Input/Outputs for communication with a data processing unit of the control unit.

The above described variations of the camera system also apply to one or more embodiments of the method of the present invention. In this case, the functional features of the camera system can be seen as method features.

Further features of the invention are apparent from the claims, the figures and the description of figures. The features and feature combinations mentioned above in the description as well as the features and feature combinations mentioned below in the description of figures and/or shown in the figures alone are usable not only in the respectively specified combination, but also in other combinations without departing from the scope of the invention. Thus, implementations are also to be considered as encompassed and disclosed by the invention, which are not explicitly shown in the figures and explained, but arise from and can be generated by separated feature combinations from the explained implementations. Implementations and feature combinations are also to be considered as disclosed, which thus do not have all of the features of an originally formulated independent claim. Moreover, implementations and feature combinations are to be considered as disclosed, in particular by the implementations set out above, which extend beyond or deviate from the feature combinations set out in the relations of the claims.

DETAILED DESCRIPTION

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description In the following description of FIGS. 1-5, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

Figure 1:
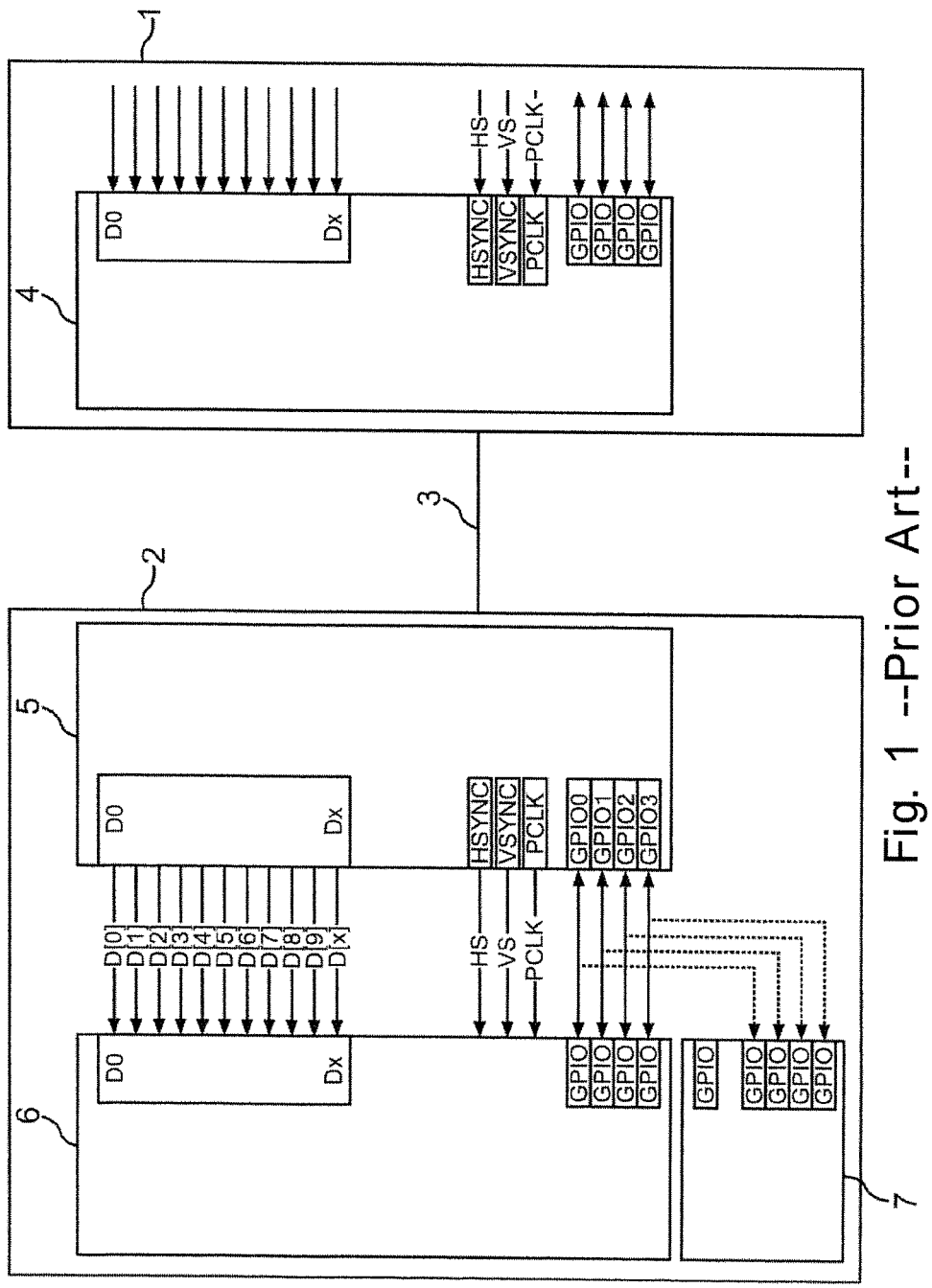
FIG. 1 is a diagram of a camera system according to the prior art.
Figure 2:
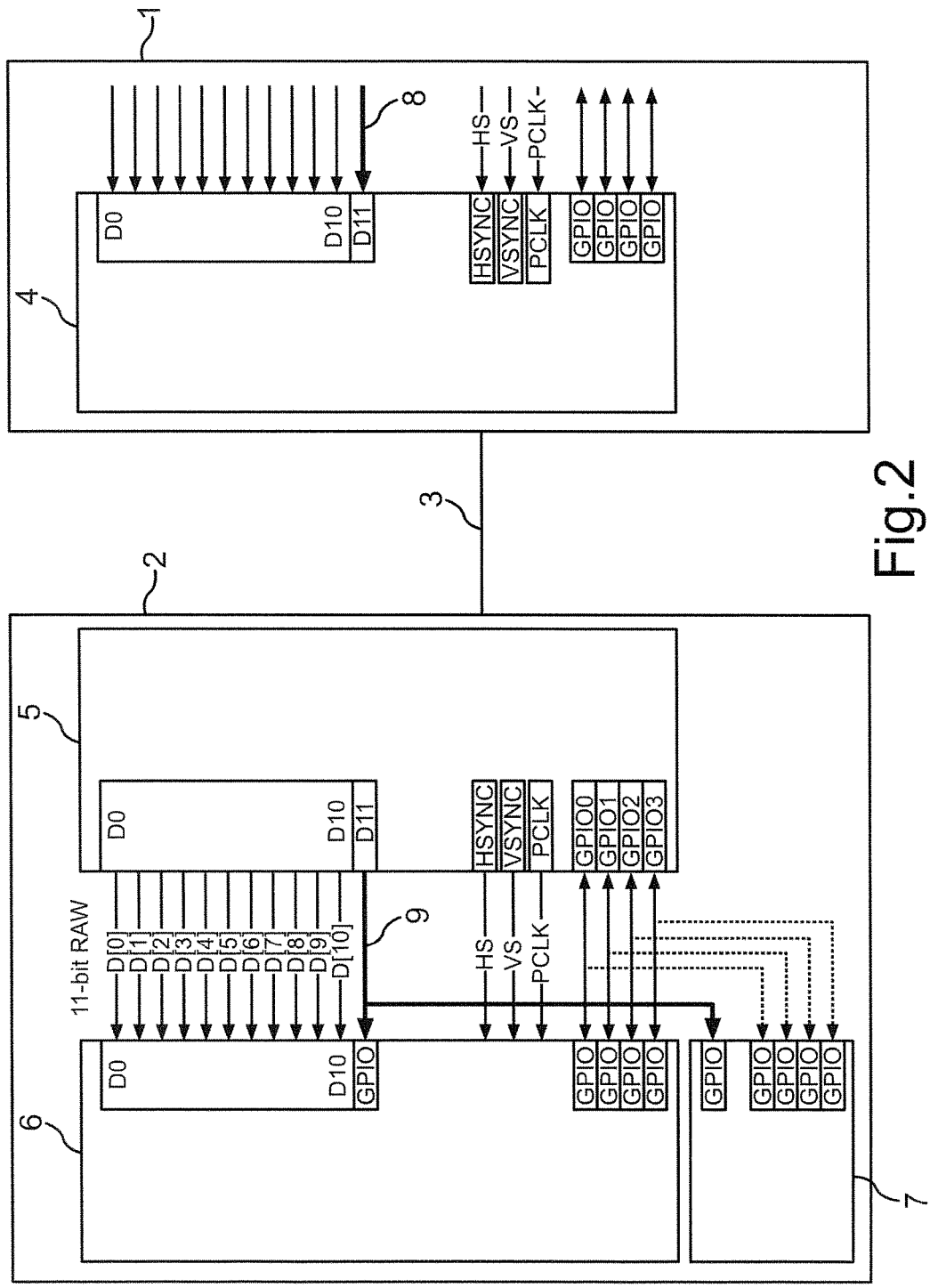
FIG. 2 is a diagram of a camera system according to one or more embodiments of the present invention.

In one or more embodiments, methods for video formats and colour depths on how to increase the number of GPIOs on the SerDes chip set are proposed by changing the SerDes configuration. FIG. 2 shows one or more embodiments of the present invention where the SerDes mode is configured as 12-bit mode. The video data are transferred using 11 bits (e.g. 11-bit RAW data format). The camera system of FIG. 2 includes the camera unit 1 and the control unit 2 and each of their respective components as discussed above in reference to FIG. 1. In one or more embodiments of FIG. 2 there are eleven video data lines conducted to eleven (D0 to D10) of twelve data pins (D0 to D11). A first control signal line 8 is conducted to the twelfth video data input D11 of the serializer 4 of the camera unit 1.

In one or more embodiments, eleven data lines D[0], D[1], . . . , D[10] are provided between respective data pins D0, D1, . . . , D10 of the deserializer 5 and the data pins D0, D1, . . . , D10 of the video processor 6. A second control signal line 9 leads from the data pin D11, which is a data pin configured as a data contact GPIO pin, of the deserializer 5 to an additional GPIO (additional to the four dedicated GPIOs of the known video processor 6; compare FIG. 1) and to the additional GPIO (unused in the example of FIG. 1) of the micro control unit 7. Therefore, one additional GPIO on the deserializer 5 is obtained. In one or more embodiments, parallel video data lines D[0], D[1], . . . , D[x] may also be used for reading/monitoring purposes (specifically monodirectional) by the video processor 6 or the micro control unit 7. That is conditional and depends on the configuration of the SerDes chip set. The method relies on certain conditions and configurations.

Figure 3:
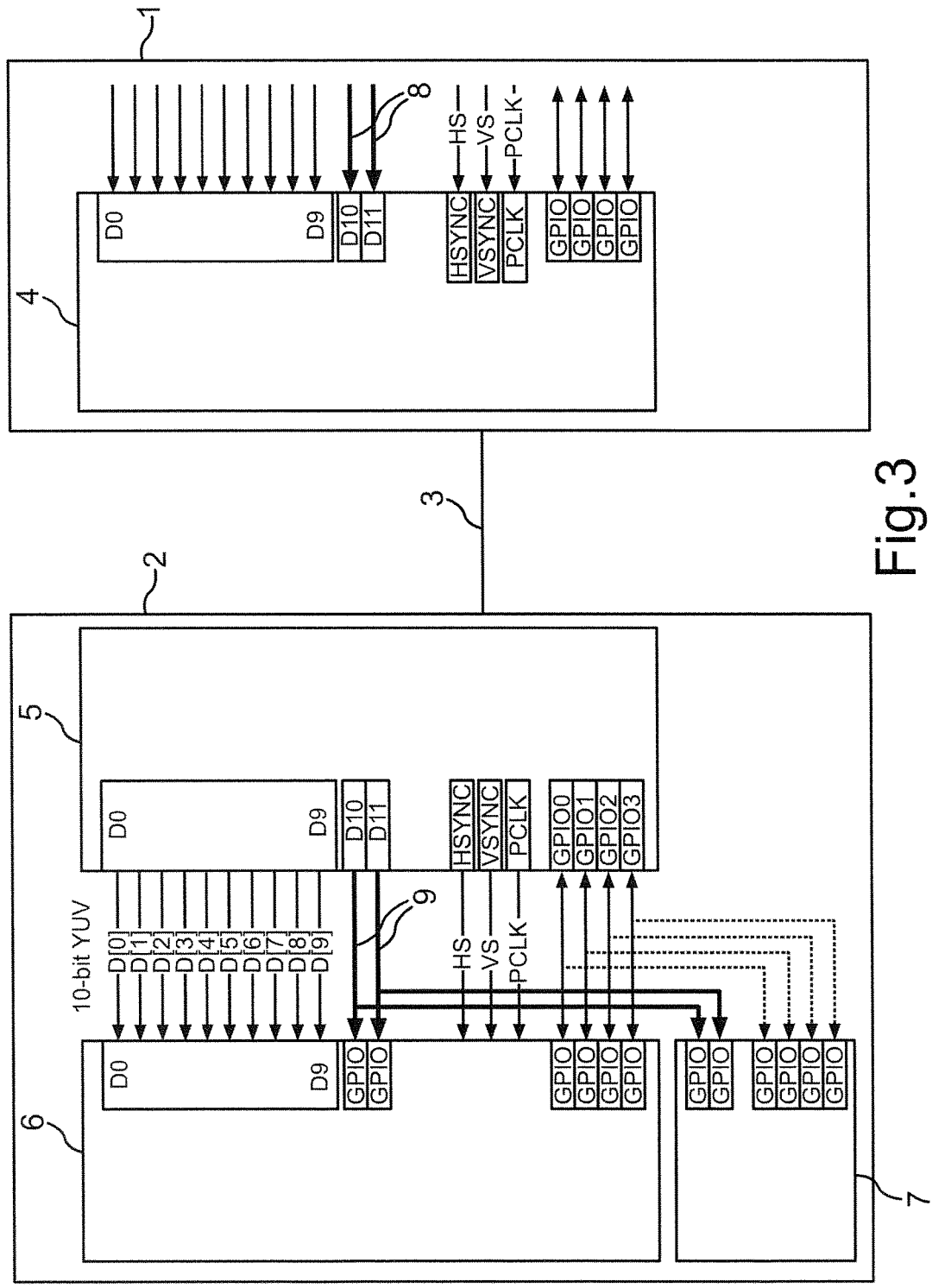
FIG. 3 is a diagram of a camera system according to one or more embodiments of the present invention.

FIG. 3 shows one or more embodiments where the mode of the SerDes is in 12-bit mode. In one or more embodiments as shown in FIG. 3, video data is transferred in 10 bits (e.g. 10-bit YUV colour model). The camera system of FIG. 3 includes the camera unit 1 and the control unit 2 and each of their respective components as discussed above in reference to FIG. 1.

In one or more embodiments as shown in FIG. 3, two data pins of the serializer 4 and the deserializer 5 are used for GPIO. In other words, the serializer 4, the deserializer 5 and the video processor 6 have ten data pins (D0, D1, . . . , D9) each. These ten data pins are used for the 10-bit YUV mode. There are two additional first control signal lines 8 conducted to data pins D10 and D11 of the serializer 4 of camera unit 1. Similarly, two second control signal lines 9 lead from the two data pins D10 and D11, which are data pins configured as data contact GPIO pins, of the deserializer 5 to respective additional GPIOs (additional to the embodiment of FIG. 1) of the video processor 6 and/or the micro control unit 7.

Figure 4:
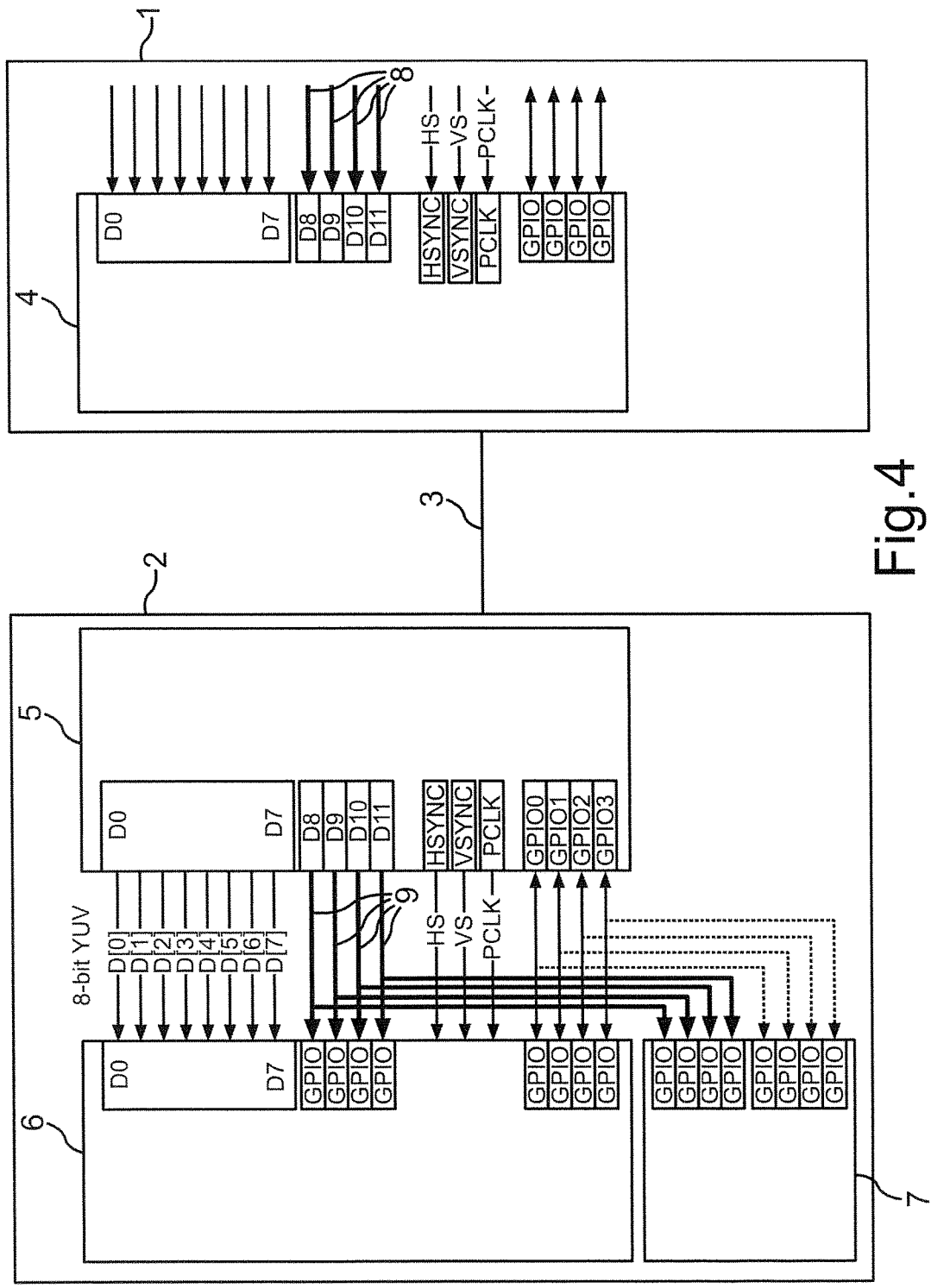
FIG. 4 is a diagram of a camera system according to one or more embodiments of the present invention.

FIG. 4 shows one or more embodiments where the SerDes mode is in 12-bit mode and the video data are transferred by 8 bit in parallel (e.g. 8-bit YUV). The camera system of FIG. 4 includes the camera unit 1 and the control unit 2 and each of their respective components as discussed above in reference to FIG. 1. In one or more embodiments as shown in FIG. 4, a 12-bit serializer/deserializer is used and 8 bit video-data are lead to respective eight data pins (D0 to D7) of the serializer 4. Similarly, parallel data lines D[0] to D[7] are provided between the respective data pins (D0 to D7) of the deserializer 5 and the video processor 6. Beside the dedicated GPIOs, which includes GPIO0, GPIO1, GPIO2 and GPIO3, the data pins D8 to D11 are also used as GPIOs for receiving signals from corresponding four first control signal lines 8.

In one or more embodiments, data pins (D8 to D11) of the deserializer 5 are configured for GPIO functionality as data contact GPIO pins. They are connected via four second control signal lines 9 to four GPIO pins of the video processor 6 and/or the micro control unit 7. Thus, the deserializer 5 is provided with four additional GPIO pins (D8 to D11) beside the dedicated GPIO pins, namely GPIO0, GPIO1, GPIO2 and GPIO3, of the serializer 4 and the deserializer 5. In one or more embodiments, four additional control signal lines 9 are used to connect the four additional GPIO pins (D8 to D11) of the deserializer 5 to respective GPIOs of the video processor 6 and the micro control unit 7.

Figure 5:
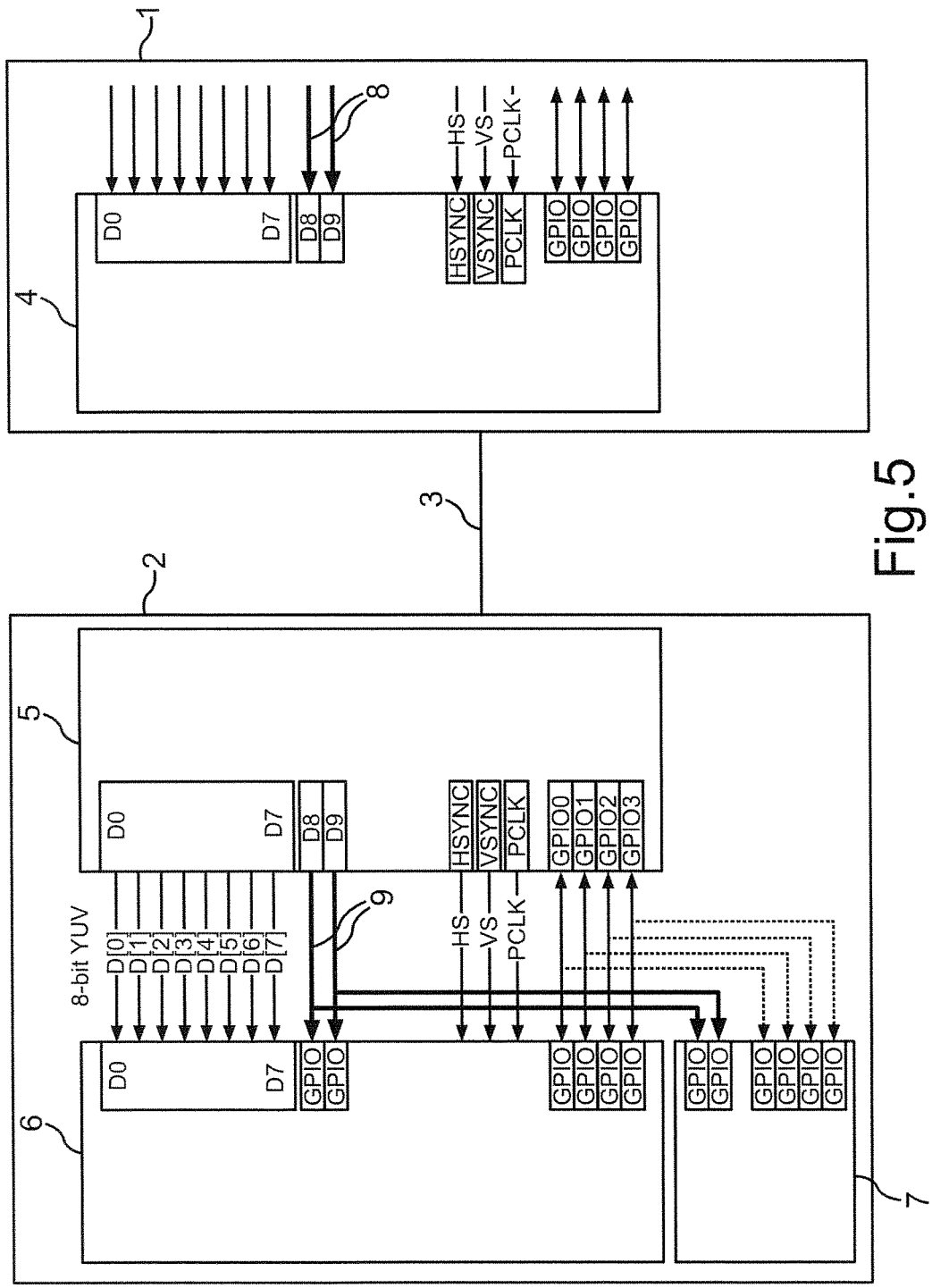
FIG. 5 is a diagram of a camera system according to one or more embodiments of the present invention.

FIG. 5 shows one or more embodiments where the SerDes mode is in 10-bit mode and the video data is transferred by 8 bit in parallel (e.g. 8-bit YUV).

In one or more embodiments as shown in FIG. 5, the serializer 4 and the deserializer 5 includes ten input/output pins (D0 to D9). Pins D0 to D7 of the serializer 4 and the deserializer 5 are used for transfer of video data with 8 bit in parallel. Pins D8 and D9 of the serializer 4 and the deserializer 5 are used as GPIO pins. Therefore, pins D8 and D9, which are data pins configured as data contact GPIO pins, of the serializer 4 receive control signals via first control signal lines 8. Consistent with the above, pins D8 and D9 of the deserializer 5 deliver control signals to two GPIO pins of the video processor 6 and/or the micro control unit 7 via second control signal lines 9. In other words, as shown in one or more embodiments of FIG. 5, two additional GPIOs are provided beside the dedicated GPIOs (GPIO0, GPIO1, GPIO2 and GPIO3) of the serializer 4 and the deserializer 5.

In one or more embodiments, certain developments are depicted in detail which may represent optional features. For instance, data lines can only be useable for reading/monitoring purposes by the micro control unit 7 and/or the video processor 6. In other words, these data lines act as GPI (General Purpose Input; from camera unit 1 to control unit 2). If there is a shortage of GPIO pins in the system, then already dedicated GPIOs on the SerDes are configured for GPO (General Purpose Output; from control unit 2 to camera unit 1 if needed) purposes and then parallel data lines coming from camera unit 1 are used for GPI. The reason for this is that video is mono-directional (source to destination).

Additionally, in one or more embodiments, the SerDes digital parallel video signal level may be configurable and dependent on the video source and the SerDes configuration. The SerDes chip set may support both 1.8 V and 3.3 V digital signal levels. The GPIOs voltage levels are mostly 1.8 V and 3.3 V, which means that digital video signals can be easily used as GPIO because voltage characteristics are the same.

Furthermore, in one or more embodiments, as video data may be available once there is a valid pixel clock (PCLK), the parallel video data monitoring as GPIO can be done once the PCLK is available and there is a video streaming. No PCLK means no video data. Thus, parallel data monitoring as GPIO is not recommended unless PCLK is received by the control unit 2.

However, this is no problem because all these events happen during boot-up, and signal monitoring can start at this point and run along a run-time.

In one or more embodiments, because data signals, e.g. for LVCMOS (Low Voltage Class of CMOS), are fully digital (representing bits and indicate logic low (0 V) or logic high (i.e. 1.8 V, 3.3 V)), the data received will be read either low or high. With that being said, data signal may not be used for voltage level monitoring for exact voltage levels, because as outlined data read will be either low or high.

In one or more embodiments, the proposed method can be used to monitor e.g. 3V3_PGOOD (3V3 camera power good), which indicates whether or not 3V3 core supply voltage is within the range. It does not give the exact 3.3 V supply voltage value. The level is either low or high and sent to the ECU (control unit 2) by connecting the signal to parallel data lines of the serializer 4. Then the level is serialized and transferred to the ECU. On the ECU side, the signal is deserialized and then read from parallel data lines by the video processor 6 and/or micro control unit 7 for any decision about the camera behavior.

In one or more embodiments, other examples can be derived for any INT/GPIO from camera devices for either 0-1.8 V or 0-3.3 V logic signals.

While the technology has been described with respect to a limited number of embodiments, those skilled in the art, having benefit of this disclosure, will appreciate that other embodiments can be devised which do not depart from the scope of the technology as disclosed herein. Accordingly, the scope of the invention should be limited only by the attached claims.

What is claimed is:

1. A camera system for a vehicle, comprising:
    a camera unit comprising:
        a serializer comprising:
            a first plurality of data contacts for parallel data input, and
            a first plurality of General Purpose Input/Output (GPIO) Pins; and
    a control unit comprising:
        a deserializer connected to the serializer, the deserializer comprising:
            a plurality of data contacts for parallel data output, and
            a second plurality of GPIO pins, and
        a first processor comprising:
            a second plurality of data contacts for parallel data input, and
            a third plurality of GPIO pins, and
    wherein:
        one or more data contacts out of the plurality of data contacts for parallel data output of the deserializer are connected to one or more GPIO pins out of the third plurality of GPIO pins of the first processor.

2. The camera system according to claim 1, wherein the first processor is at least one of a system-on-chip or a micro control unit.

3. The camera system according to claim 1, wherein the control unit is of the low voltage differential signaling type.

4. The camera system according to claim 1, wherein the second plurality of GPIO pins of the deserializer are connected to a corresponding number of GPIO pins out of the third plurality of GPIO pins of the first processor.

5. The camera system according to claim 1, wherein one or more data contacts out of the plurality of data contacts for parallel data output of the deserializer are used as a fourth plurality of GPIO pins only deployable for output purposes.

6. The camera system according to claim 1, wherein a digital parallel video signal level of the serializer is configurable.

7. The camera system according to claim 1, wherein a pixel clock (PLCK) is used for data transfer from the data contacts for parallel data output of the deserializer.

8. A driver assistance system comprising a camera system according to claim 1.

9. A vehicle comprising a driver assistance system of claim 8.

10. The camera system according to claim 1, further comprising a Serializer-Deserializer (SerDes) configured in 10-bit mode or higher.

11. The camera system according to claim 1, wherein the second plurality of data contacts for parallel data input of the first processor are used as inputs to read/monitor a status of a video camera.

12. A method for operating a camera system for a vehicle, the camera system comprising
    a camera unit comprising a serializer, and a control unit,
        the control unit comprising a deserializer connected to the serializer and a first processor,
        the serializer comprising a first plurality of data contacts for parallel data input and a first plurality of General Purpose Input/Output (GPIO) Pins,
        the deserializer comprising a plurality of data contacts for parallel data output and a second plurality of GPIO pins, and
        the first processor comprising a second plurality of data contacts for parallel data input and a third plurality of GPIO pins,
    the method comprising:
        using one or more data contacts out of the plurality of data contacts for parallel data output of the deserializer connected to one or more of the GPIO pins out of the third plurality of GPIO pins of the first processor and
        transmitting control data via the one or more data contacts out of the plurality of data contacts for parallel data output of the deserializer.

13. The method for operating a camera system according to claim 12, wherein the method further comprises using the second plurality of data contacts for parallel data input of the first processor as inputs to read/monitor a status of a video camera.

14. A camera system for a vehicle, comprising:
    a camera unit comprising a serializer;
    a control unit comprising:
        a deserializer comprising:
            a plurality of data contacts for parallel data output, and
            a first plurality of GPIO pins,
        a first processor comprising:
            a plurality of data contacts for parallel data input, and
            a second plurality of GPIO pins, and
    wherein one or more data contacts out of the plurality of data contacts for parallel data output of the deserializer are connected to one or more GPIO pins out of the second plurality of GPIO pins of the first processor.

15. The camera system according to claim 14, wherein the control unit further comprises a second processor comprising a third plurality of GPIO pins.

16. The camera system according to claim 15, wherein one or more data contacts out of the plurality of data contacts for parallel data output of the deserializer are connected to one or more GPIO pins out of the third plurality of GPIO pins of the second processor.

* * * * *